United States Patent
Shin (10) Patent No.: US 8,575,734 B2
(45) Date of Patent: Nov. 5, 2013

(54) LEAD FRAME

(75) Inventor: KyungHo Shin, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 149 days.

(21) Appl. No.: 13/182,651

(22) Filed: Jul. 14, 2011

(65) Prior Publication Data

US 2012/0012885 A1    Jan. 19, 2012

(30) Foreign Application Priority Data

Jul. 15, 2010    (KR) .................... 10-2010-0068647

(51) Int. Cl.
*H01L 23/495*    (2006.01)

(52) U.S. Cl.
USPC ................................ 257/668; 257/E23.066

(58) Field of Classification Search
USPC ............... 257/676, 668, E23.06, E23.066
See application file for complete search history.

(56) References Cited

U.S. PATENT DOCUMENTS

| | | | | |
|---|---|---|---|---|
| 3,753,289 A | * | 8/1973 | Berner | 438/109 |
| 5,633,206 A | * | 5/1997 | Kim et al. | 29/827 |
| 7,201,511 B2 | * | 4/2007 | Moriyama et al. | 362/646 |
| 7,671,374 B2 | * | 3/2010 | Wang et al. | 257/91 |
| 8,168,989 B2 | * | 5/2012 | Isobe | 257/88 |
| 2003/0079895 A1 | | 5/2003 | Takakura et al. | 174/52.1 |

FOREIGN PATENT DOCUMENTS

| | | |
|---|---|---|
| JP | 2001-024270 A | 1/2001 |
| JP | 2002-026437 A | 1/2002 |
| JP | 2002-280598 A | 9/2002 |

OTHER PUBLICATIONS

Korean Office Action dated Aug. 26, 2011 issued in Application No. 10-2010-0068647.
Korean Notice of Allowance dated Feb. 20, 2012 issued in Application No. 10-2010-0068647.

* cited by examiner

*Primary Examiner* — William D Coleman
(74) *Attorney, Agent, or Firm* — KED & Associates LLP (57) ABSTRACT

A lead frame enabling simultaneous burn-in testing of plural LEDs while the LEDs are mounted thereon is disclosed. The lead frame according to embodiments of this disclosure may enable burn-in testing of LEDs before packaging.

20 Claims, 7 Drawing Sheets

LEAD FRAME

CROSS-REFERENCE TO RELATED APPLICATION

This application claims the benefit of Korean Application No. 10-2010-0068647, filed on Jul. 15, 2010 in the Korean Intellectual Property Office, the disclosure of which is incorporated herein by reference.

BACKGROUND OF THE DISCLOSURE

1. Field of the Disclosure

The present disclosure relates to a lead frame, and more particularly, an exemplary embodiment of the present disclosure relates to a lead frame enabling test of a plurality of light emitting devices while mounting the same on the lead frame.

2. Description of the Related Art

A light emitting device (LED) is a semiconductor device converting electric energy into light and generally has various advantages such as low power consumption, a semi-permanent lifespan, a rapid response speed, safety, environmental friendliness, etc., compared to existing light sources such as a fluorescent lamp, an incandescent lamp, or the like. Therefore, extensive studies are currently focusing on replacement of existing light sources by LEDs, and use of LEDs as light sources of various lamps, LCDs, display boards, street lamps, etc., which are used in indoor and/or outdoor places has a recent tendency to increase. Meanwhile, an LED is subjected to a burn-in test after a light emitting chip is mounted on a lead frame and packaged using a synthetic resin. A conventional LED test method generally requires a long period of time, thus decreasing the productivity of LED manufacture.

SUMMARY OF THE DISCLOSURE

Therefore, an aspect of the present disclosure relates to provision of a lead frame enabling testing of LEDs while mounting the LEDs on the lead frame.

Also, another aspect of the present disclosure provides a lead frame enabling simultaneous 'burn-in testing' of plural LEDs.

According to an aspect of the present disclosure, there is provided a lead frame, including; a first guide frame and a second guide frame, which are made of a conductive material and are positioned apart from each other, and at least one electrode pad disposed between the first and second guide frames, on which an LED is mounted.

According to another aspect of the present disclosure, there is provided a lead frame, having a plurality of sub-frames combined by a non-conductive insulating material, which are arranged in an array form in at least one of transverse and longitudinal directions, wherein each of the sub-frames includes; a first guide frame and a second guide frame, which are made of a conductive material and are positioned apart from each other, and at least one electrode pad disposed between the first and second guide frames, on which an LED is mounted.

According to a still further aspect of the present disclosure, there is provided a lead frame, including; a main frame, a first frame formed in a first direction of the main frame, a second frame forming a lattice structure against the first direction to provide a plurality of sub-frames, and at least one LED arranged on each of the sub-frames, wherein each of the sub-frames has at least one insulating part at one side of a region on which the first frame intersects the second frame.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE PREFERRED EMBODIMENTS

Embodiments of the present disclosure will be described below with reference to the attached drawings.

In the detailed description of exemplary embodiments, if there is a description that each layer (film), region, pattern or structure is formed "on", "under", "upper(above)" or "lower (below)" of a substrate, each layer (film), region, pad, pattern or other structure, the terms "on", "under", "upper(above)" or "lower(below)" may be commonly employed in both a case of "directly" forming the foregoing layer (film), region, pattern or structure, and a case of "indirectly" forming the same by interposing "another layer or structure" therebetween.

A relationship between locations of layers or structures will be explained with reference to the detailed description of the present application and/or the accompanying drawings.

Thicknesses and/or sizes of respective layers shown in the accompanying drawings may be enlarged, omitted or schematically illustrated for convenience or clarity. In addition, sizes and areas of respective elements may not entirely reflect real sizes and areas thereof.

Hereinafter, with reference to the accompanying drawings, an LED according to an embodiment of the present disclosure will be described in detail.

Figure 1A:
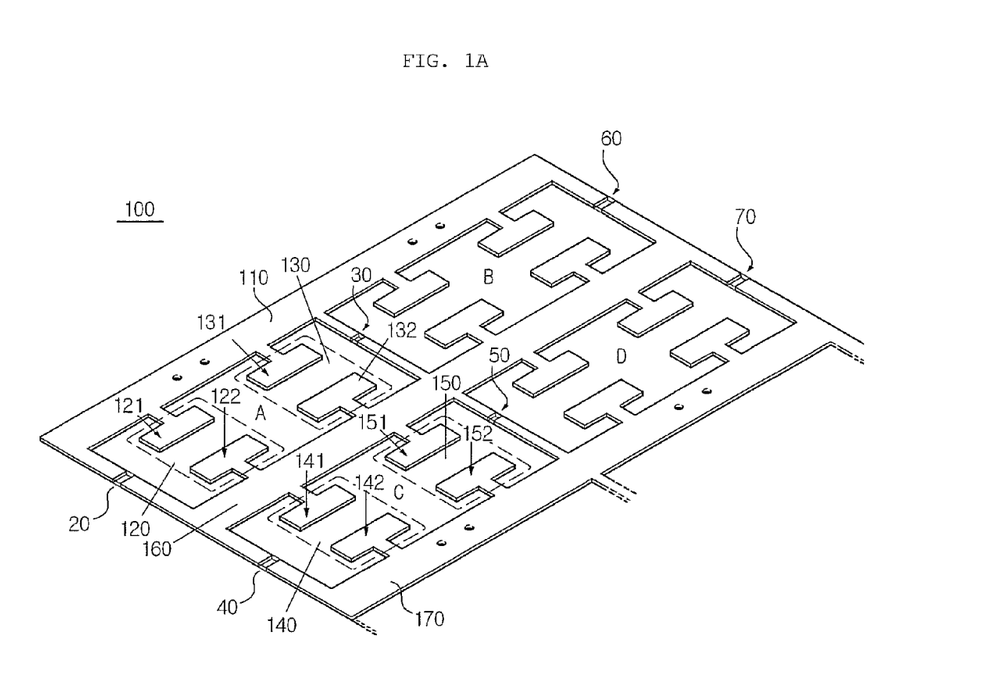
FIG. 1A is a top perspective view showing a lead frame according to one embodiment.
Figure 1B:
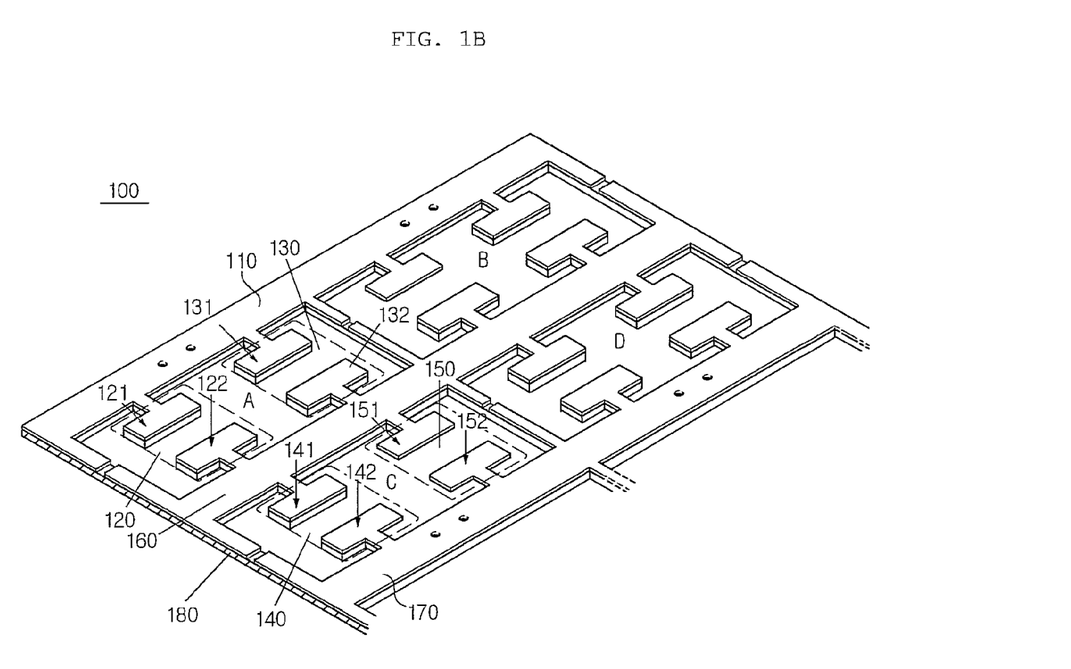
FIG. 1B is a top perspective view showing a lead frame according to one embodiment.
Figure 2:
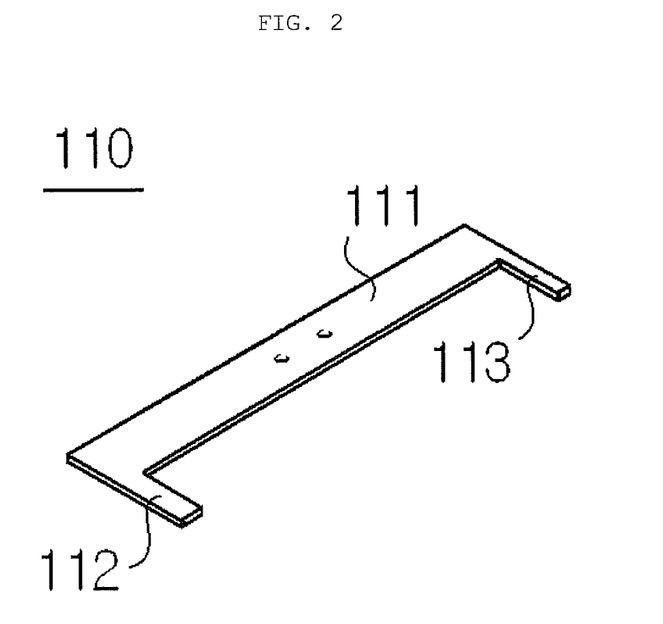
FIG. 2 is a detailed view illustrating a first guide frame of the foregoing lead frame.
Figure 3:
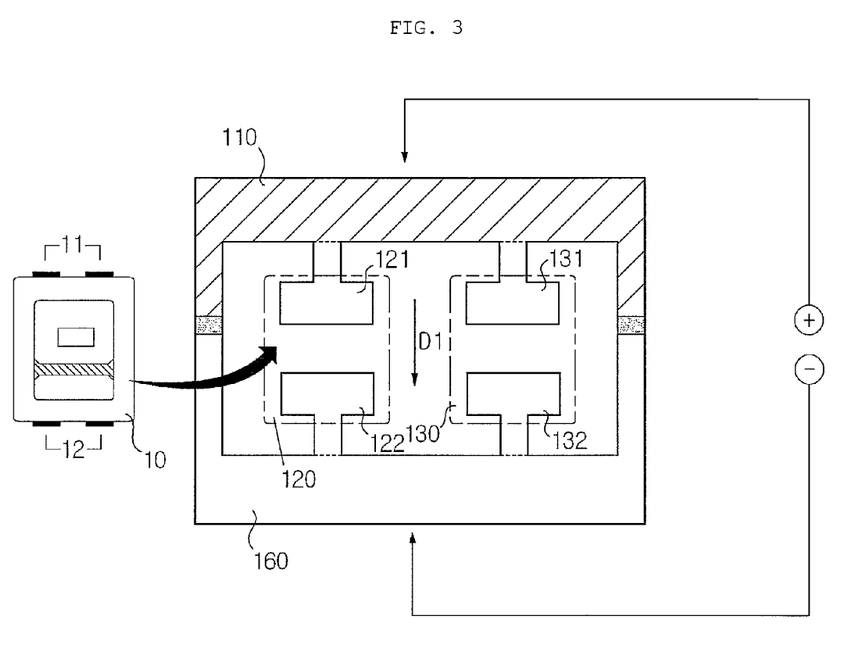
FIG. 3 is a reference view illustrating a test method of an LED using a lead frame according to one embodiment.

FIGS. 1A and 1B are top perspective views showing a lead frame according on embodiments, FIG. 2 is a detailed view illustrating a first guide frame of the foregoing lead frame, and FIG. 3 is a reference view illustrating a test method of an LED using a lead frame according to one embodiment.

Referring to FIGS. 1A through 3, the lead frame according to the foregoing embodiment may include a first guide frame 110, a second guide frame 160, a third guide frame 170, insulating materials 20, 30, 40, 50, 60 and 70, and electrode pads 120, 130, 140 and 150. The first guide frame 110 through the third guide frame 170 are made of a metal or conductive material and may form an outer rim of the lead frame 100 and a lattice structure therein.

The first guide frame may have a main frame 111 and side frames 112 and 113. The side frames 112 and 113 may form a region in which the electrode pads 120 and 130 are arranged and LEDs are mounted on the electrode pads. In the region formed by the side frames 112 and 113, one pair of electrode pads (for example, 120 and 130) is typically arranged. However, if a gap between the side frames 112 and 113 is widening, the number of electrodes to be arranged may be increased.

Similarly, the second guide frame 160 and the third guide frame 170 may form a region in which the electrode pads 140 and 150 are arranged.

A lower side of the main frame 111 may be connected to an upper side of the electrode pads 120 and 130, and the electrode pads 120 and 130 connected to the main frame 111 may be made of the same material as the main frame 111 and be integrated with the same.

The electrode pad 120, 130, 140 or 150 may include, for example, at least one selected from titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe), without being particularly limited thereto. In addition, the electrode pads 120, 130, 140 or 150 may have a single layer or multi-layer structure, without being particularly limited thereto.

In this regard, the electrode pad 120 may include a first pad 121 and a second pad 122 and the first and second pads 121 and 122 are spaced and electrically insulated from each other. When an LED 10 is mounted on the electrode pad 120, a first electrode 11 of the LED 10 is connected to the first pad 121 while a second electrode 12 thereof is connected to the second pad 122, thus enabling the LED 10 to be driven by positive (+) voltage applied to the first guide frame 110 and negative (−) voltage applied to the second guide frame 160.

Likewise, since the electrode pads 130, 140 and 150 are connected with LEDs according to the same process as the electrode pad 120 connected with the LED 10, a repetitive description will be omitted.

In one region of the side frames 112 and 113, the insulating materials 20, 30, 40, 50, 60 and 70 may be provided to electrically isolate the first guide frame 110 and the second guide frame 160 from each other. The insulating materials 20, 30, 40, 50, 60 and 70 may be made of at least one selected from epoxy, silicon, polyimide or synthetic resins.

After applying the insulating materials 20, 30, 40, 50, 60 and 70 to a gap region between the first guide frame 110 and the second guide frame 160, the insulating parts 20, 30, 40, 50, 60 and 70 may be cured to fix the first and second guide frames 110 and 160.

Also, as shown in FIG. 1B, the insulating material 180 is formed on the bottom side of the lead frame 100, in order to fix the first to third guide frames 110, 160 and 170 or, otherwise, each of the electrode pads 120, 130, 140 or 150. For instance, the insulating material 180 may be a polyimide film applied to the bottom side of the lead frame 100, as shown in FIG. 1B.

Other than epoxy, silicon, polyimide and synthetic resin materials described above, the insulating materials 20, 30, 40, 50, 60 and 70 may include adhesive materials such as an epoxy based adhesive, an acrylonitrile based compound, apolyimide resin or the like.

The insulating materials 20 and 30 serve to combine the first guide frame 110 and the second guide frame 160 while electrically insulating the first guide frame 110 and the second guide frame 160 from each other. Therefore, any material capable of combining the first guide frame 110 and the second guide frame 160 while electrically insulating the first guide frame 110 and the second guide frame 160 from each other may be used without being particularly limited to the materials described in the detailed description.

The electrode pads 120, 130, 140 and 150 are arranged in a region formed by the side frames 112 and 113 at the first guide frame 110 side and the side frames 112 and 113 at the second guide frame 160, wherein these guide frames are fixed by the insulating materials 20, 30, 40, 50, 60 and 70.

Each of the electrode pads 120, 130, 140 and 150 includes a first pad 121 combined with one of two electrodes and a second pad 122 combined with the other, and an area and a location thereof may be determined in consideration of positions of electrodes 11 and 12 in the LED 10.

Referring to FIG. 1A, when the LED 10 is mounted on the electrode pads 120 and 130, positive (+) and negative (−) voltages may be applied to the first guide frame 110 and the second guide frame 160, respectively, so as to conduct 'burn-in testing' of the LED (that is, reference number '10') mounted on the electrode pads 120 and 130.

Furthermore, when the LED is mounted on the electrode pads 140 and 150, positive (+) voltage must be applied to the second guide frame 160 while applying negative (−) voltage to the third guide frame 170.

Alternatively, after the LED (that is, reference number '10') is mounted on each of the electrode pads 120, 130, 140 and 150, all of the LEDs mounted on the electrode pads 120, 130, 140 and 150 may be subjected to burn-in testing by applying positive (+) voltage to the first guide frame 110 and negative (−) voltage to the third guide frame 170.

In other words, according to the embodiment of the present disclosure, as positive (+) voltage is applied to a guide frame (that is, reference number '110') located at the uppermost side of the lead frame 100 and negative (−) voltage is applied to another guide frame (that is, reference number '170') located at the lowermost side of the lead frame, LEDs mounted on both ends of these guide frames (that is, reference numbers '110' and '170') may be simultaneously subjected to burn-in testing.

Again referring to FIG. 1A, when LEDs are mounted on the electrode pads 120, 130, 140 and 150, a current path may be formed by the LEDs. Therefore, by applying negative (−) voltage to the third guide frame 170 and positive (+) voltage to the first guide frame 110, all of the LEDs mounted on the electrode pads 120, 130, 140 and 150 are driven, thereby conducting burn-in testing.

Meanwhile, as shown in FIG. 1A, the lead frame 100 is partitioned into four (4) sub-frames A, B, C and D. Since the sub-frames A, B, C and D are electrically insulated from one another by the insulating materials 30 and 50, the electrode pads 120, 130, 140 and 150, as well as LEDs mounted on the electrode pads 120, 130, 140 and 150, may not short circuit.

Figure 4:
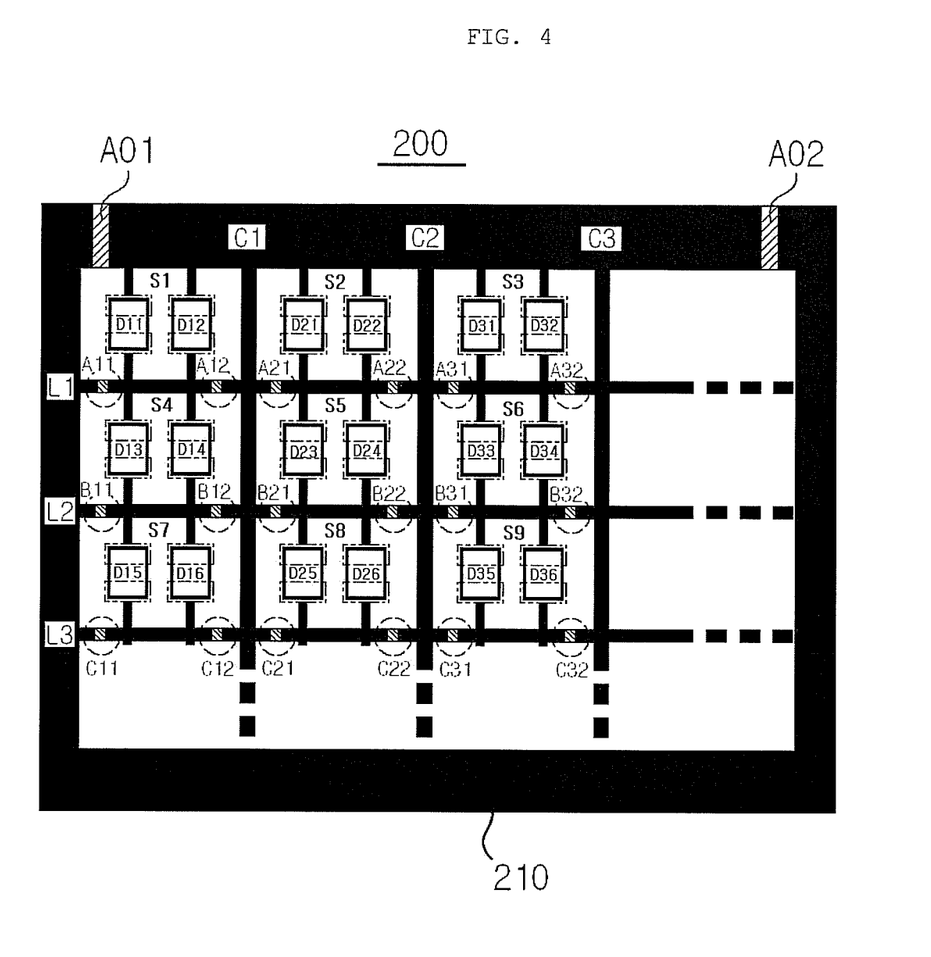
FIG. 4 is a top perspective view illustrating a lead frame according to one embodiment.
Figure 5:
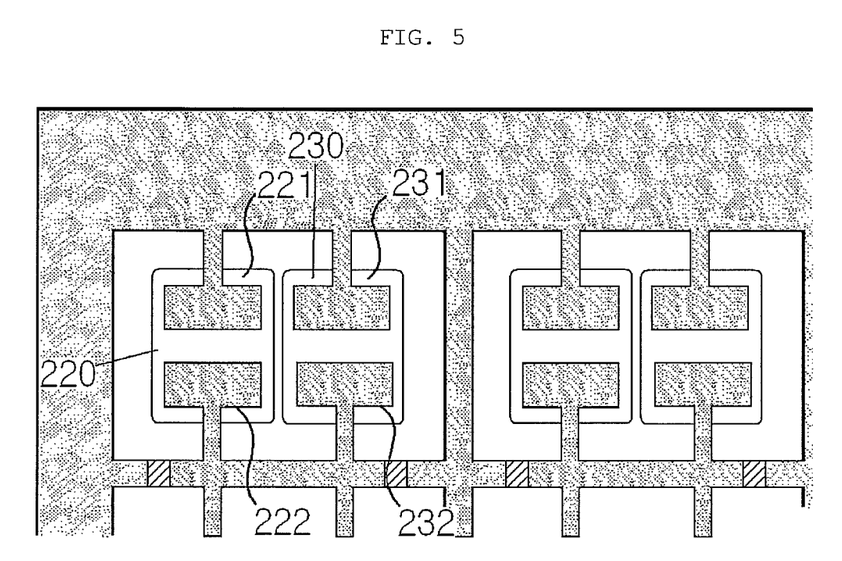
FIG. 5 is a detailed reference view illustrating a lead frame according to one embodiment.

FIG. 4 is a top perspective view illustrating a lead frame 200 according to one embodiment and FIG. 5 is a detailed reference view illustrating a lead frame 200 according to one embodiment.

Referring to FIGS. 4 and 5, the lead frame 200 according to the embodiment of the present disclosure may include a plurality of first frames L1, L2 and L3, and a plurality of second frames C1, C2 and C3, wherein these frames form a lattice structure in a main frame 210. Also, a plurality of sub-frames S1 through S9 are formed by the first frames L1 through L3 and the second frames C1 through C3, respectively.

According to FIG. 4, the first frames L1, L2 and L3 are provided in a transverse direction while the second frames C1, C2 and C3 are arranged in a longitudinal direction. However, without particular limitation, the directions in which the first frames L1, L2 and L3, and the second frames C1, C2 and C3 are arranged may be reversed with respect to each other.

LEDs D11 through D36 are arranged in respective sub-frames S1 through S9, and one or two, or more LEDs may be placed in each of the sub-frames S1 to S9. FIG. 4 illustrates two LEDs arranged in each of the sub-frames S1 to S9.

Insulating materials A11 through C32 are formed at both ends of the respective first frames L1, L2 and L3, as well as at both ends of the main frame 210.

The insulating materials A01 and A02 placed on both ends of the main frame 210 are provided to allow the LEDs D11 through D36 to receive positive (+) and negative (−) voltages, respectively, and then, to be driven. Only two of the insulating materials A01 and A02 are required for the overall main frame 210 and may be formed on top of the main frame 210 or at right and left sides thereof.

However, the insulating materials A01 and A02 must be provided at a site that does not interrupt power supply toward the LEDs D11, D15, D32 and D36. With regard to the embodiment shown in FIG. 4, the insulating material A01 preferably leans to the left while the insulating material A02 preferably leans to the right more than shown in the figure.

In addition, the insulating material (not shown) may be formed throughout the bottom side of the lead frame 200 to fix the first frames L1, L2 and L3, the second frames C1, C2 and C3, and the sub-frames S1 to S9, respectively, as described above. Here, the insulating materials (not shown) may be composed of a polyimide film.

The insulating materials A01 and A02 formed on the main frame 210, and the insulating materials A11 through C32 formed on the first frames L1, L2 and L3 may be molded using a non-conductive material. For instance, after applying a non-conductive material such as silicon, epoxy, polyimide, an epoxy based adhesive, an acrylonitrile based compound, or the like, to the insulating materials A01, A02, A11 through C32, the non-conductive material is cured to thereby prevent the first frames L1, L2 and L3 from being released from the main frame 210 by the insulating materials A01, A02, and A11 through C32.

After molding the insulating materials A01, A02, and A11 through C32, the LEDs (D11 through D36) are mounted on the electrode pads 220 and 230 and subjected to soldering. Thereafter, positive (+) voltage is applied to the top side of the main frame 210 (between A01 to A02) while negative (−) voltage is applied to the bottom side of the main frame 210, to thereby enable burn-in testing of LEDs D11 through D36.

In this case, the electrode pad 220 may have a first pad 221 and a second pad 222, and these pads must be electrically isolated from each other before mounting the LED D11 thereon.

Meanwhile, as described above, the electrode pad 220 may include, for example, at least one selected from titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe), without being particularly limited thereto. In addition, the electrode pad 220 may have a single layer or multi-layer structure, without being particularly limited thereto.

Since the LED D11 has a diode characteristic of forming a unidirectional current path only, positive (+) and negative (−) voltage short circuits do not occur after mounting the LED D11 on the first and second pads 221 and 222.

Like the electrode pad 220, a first pad 231 and a second pad 232 of the electrode pad 230 must also be electrically insulated from each other before mounting the LED D12 thereon.

Figure 6:
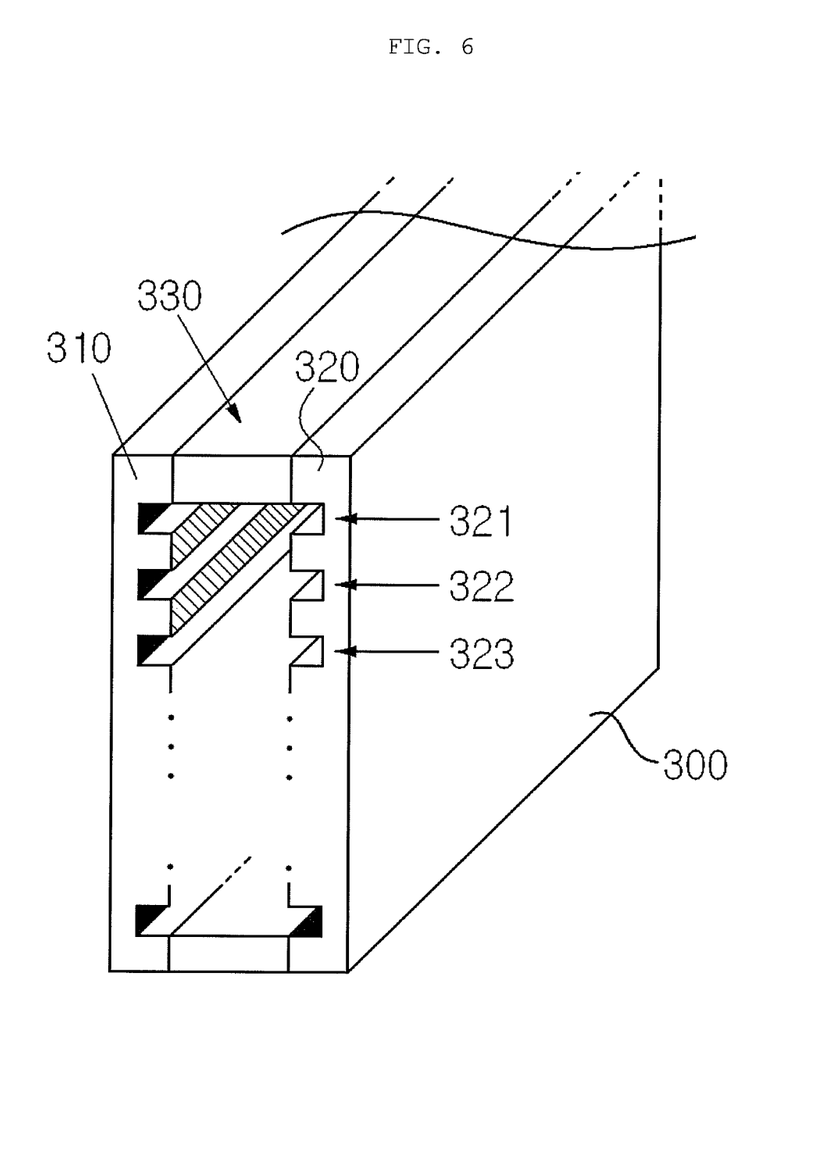
FIG. 6 illustrates an example of a magazine executing burn-in test of a lead frame according to one embodiment.

FIG. 6 illustrates an example of a magazine executing burn-in test of a lead frame according to one embodiment.

Referring to FIG. 6, the magazine includes a plurality of slots 321, 322 and 323 to receive the lead frames 100 and 200, and a first body 310 and a second body 320 which are formed at both ends of the slots 321, 322 and 323 and have slot grooves for the slots.

The first and second bodies 310 and 320 are made of a metal material to supply power to the lead frames 100 and 200 fitted into the slots 321, 322 and 323, respectively.

An insulating material 330 may be provided between the first body 310 and the second body 320 to electrically insulate the same. The insulating material 330 may be made of plastic, synthetic resin or other non-conductive materials and, preferably, formed of a material having excellent thermal resistance to prevent damage caused by heat generated during burn-in test.

When the lead frames 100 and 200 are fitted into the slots 321, 322 and 323, positive (+) voltage is applied to one sides of the lead frames 100 and 200 while negative (−) voltage is applied to the other sides thereof, to thereby supply power to a plurality of LEDs mounted on the main frames 100 and 200. In such state, the magazine 300 may vary voltage and/or current of the power supply, enable observation of variation in characteristics of LEDs received in the magazine 300 after applying rated voltage and rated current, and/or alter an internal temperature of the magazine 300 to test reliability of the LEDs.

In addition to the foregoing, burn-in testing may be conducted under different test conditions (for example, humidity, dust, etc.) according to instructions of manufacturers, without being particularly limited thereto.

As such, the lead frame according to the foregoing embodiments of the present disclosure may enable burn-in testing of LEDs before packaging the same.

The lead frame according to the foregoing embodiments of the present disclosure may enable simultaneous testing of a plurality of LEDs.

Characteristics, configurations and effects described in the foregoing embodiments are included in at least one exemplary embodiment of the present disclosure and not limited to only one embodiment. Moreover, it will be understood by those of ordinary skill in the art that characteristics, configurations and effects illustrated in the embodiments set forth herein may be combined or modified in other embodiments. Therefore, such combinations and variations may be construed as falling within the scope of the present disclosure.

While the present disclosure has been particularly shown and described with reference to exemplary embodiments thereof, these embodiments are only proposed for illustration purposes and do not restrict the present disclosure, and it will be apparent to those skilled in the art that various changes in form and details may be made without departing from essential characteristics of the embodiments set forth herein. For example, respective configurations stipulated in the embodiments may be modified and applied. Further, differences in such modifications and applications should be construed as falling within the scope of the present disclosure as defined by the appended claims.

What is claimed is:
1. A lead frame, comprising:
   a first guide frame and a second guide frame that are made of a conductive material and are spaced from each other;
   at least one electrode pad connected between the first guide frame and the second guide frame, on which an LED is mounted; and
   an insulating material formed under the first guide frame and the second guide frame to fix the first guide frame and the second guide frame.

2. The lead frame according to claim 1, wherein the insulating material provided between the first guide frame and the second guide frame to fix the first guide frame and the second guide frame.

3. The lead frame according to claim 1, wherein the insulating material is a polyimide film.

4. The lead frame according to claim 2, wherein the insulating material has adhesive property.

5. The lead frame according to claim 2, wherein the insulating material includes at least one selected from epoxy, silicon, acryl, polyimide and synthetic resin.

6. The lead frame according to claim 3, wherein the electrode pad includes:
a first pad to apply a first voltage; and
a second pad to apply a second voltage.

7. The lead frame according to claim 6, wherein the first and second pads are electrically connected to the first and second guide frames, respectively.

8. The lead frame according to claim 6, wherein the first and second pads are respectively integrated with the first and second guide frames.

9. The lead frame according to claim 6, wherein the electrode pad includes at least one selected from titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe).

10. The lead frame according to claim 6, wherein the electrode pad has a multi-layer structure.

11. A lead frame, comprising:
a first frame and a second frame forming a lattice structure in a main frame, in order to form a plurality of sub-frames;
at least one electrode pad arranged on each of the sub-frames, on which an LED is mounted; and
an insulating material formed under the first guide frame and the second guide frame to fix the first guide frame and the second guide frame.

12. The lead frame according to claim 11, wherein the electrode pad in each of the sub-frames is arranged in an array form in at least one of a first direction and a second direction perpendicular to the first direction.

13. The lead frame according to claim 11, wherein the insulating material has adhesive property.

14. The lead frame according to claim 11, wherein the insulating material includes at least one selected from epoxy, silicon, acryl, polyimide and synthetic resin.

15. The lead frame according to claim 13, wherein the insulating material is a polyimide film.

16. The lead frame according to claim 15, the electrode pad includes at least one selected from titanium (Ti), copper (Cu), nickel (Ni), gold (Au), chromium (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe).

17. The lead frame according to claim 15, wherein the electrode pad has a multi-layer structure.

18. The lead frame according to claim 15, wherein the electrode pad includes:
a first pad to apply a first voltage; and
a second pad to apply a second voltage.

19. The lead frame according to claim 15, wherein the first and second pads are electrically connected to the first and second guide frames, respectively.

20. The lead frame according to claim 15, wherein the first and second pads are respectively integrated with the first and second guide frames.

* * * * *